United States Patent
Lindner et al.

(10) Patent No.: US 7,202,718 B2
(45) Date of Patent: Apr. 10, 2007

(54) ERROR-COMPENSATED CHARGE PUMP CIRCUIT, AND METHOD FOR PRODUCING AN ERROR-COMPENSATED OUTPUT CURRENT FROM A CHARGE PUMP CIRCUIT

(75) Inventors: Manfred Lindner, Unterhaching (DE); Roland Schwenk, Oberhaching (DE)

(73) Assignee: Infineon Technologies AG, Munich (DE)

( * ) Notice: Subject to any disclaimer, the term of this patent is extended or adjusted under 35 U.S.C. 154(b) by 34 days.

(21) Appl. No.: 11/104,706

(22) Filed: Apr. 13, 2005

(65) Prior Publication Data

US 2005/0237091 A1     Oct. 27, 2005

(30) Foreign Application Priority Data

Apr. 22, 2004   (DE) ...................... 10 2004 019 652

(51) Int. Cl.
*H03L 7/06* (2006.01)
(52) U.S. Cl. .................. 327/157; 327/148; 327/536
(58) Field of Classification Search ........ 327/156–159, 327/147–149, 536
See application file for complete search history.

(56) References Cited

U.S. PATENT DOCUMENTS

| | | | |
|---|---|---|---|
| 6,124,755 A | 9/2000 | Parker et al. | |
| 6,320,435 B1 | 11/2001 | Tanimoto | |
| 6,812,754 B1 * | 11/2004 | Nakanishi | 327/157 |
| 6,850,102 B2 * | 2/2005 | Hsu et al. | 327/157 |
| 6,897,692 B1 * | 5/2005 | Hughes | 327/157 |
| 7,020,793 B1 * | 3/2006 | Hsieh | 713/401 |
| 7,123,085 B2 * | 10/2006 | Gu | 327/590 |
| 2003/0076141 A1 | 4/2003 | Hsu et al. | |

FOREIGN PATENT DOCUMENTS

DE    199 39 104 A1    7/2001

* cited by examiner

*Primary Examiner*—Dinh T. Le
(74) *Attorney, Agent, or Firm*—Eschweiler & Associates, LLC

(57) ABSTRACT

A charge pump circuit has a charge pump having at least two switched current sources arranged in series. The difference between the currents produced in the two switched current sources contributes to the output current from the charge pump. At least one of the two current sources is controlled by means of a control signal. A control circuit produces the control signal for the at least one controlled current source such that the currents produced in the two current sources are regulated to the same value.

14 Claims, 2 Drawing Sheets

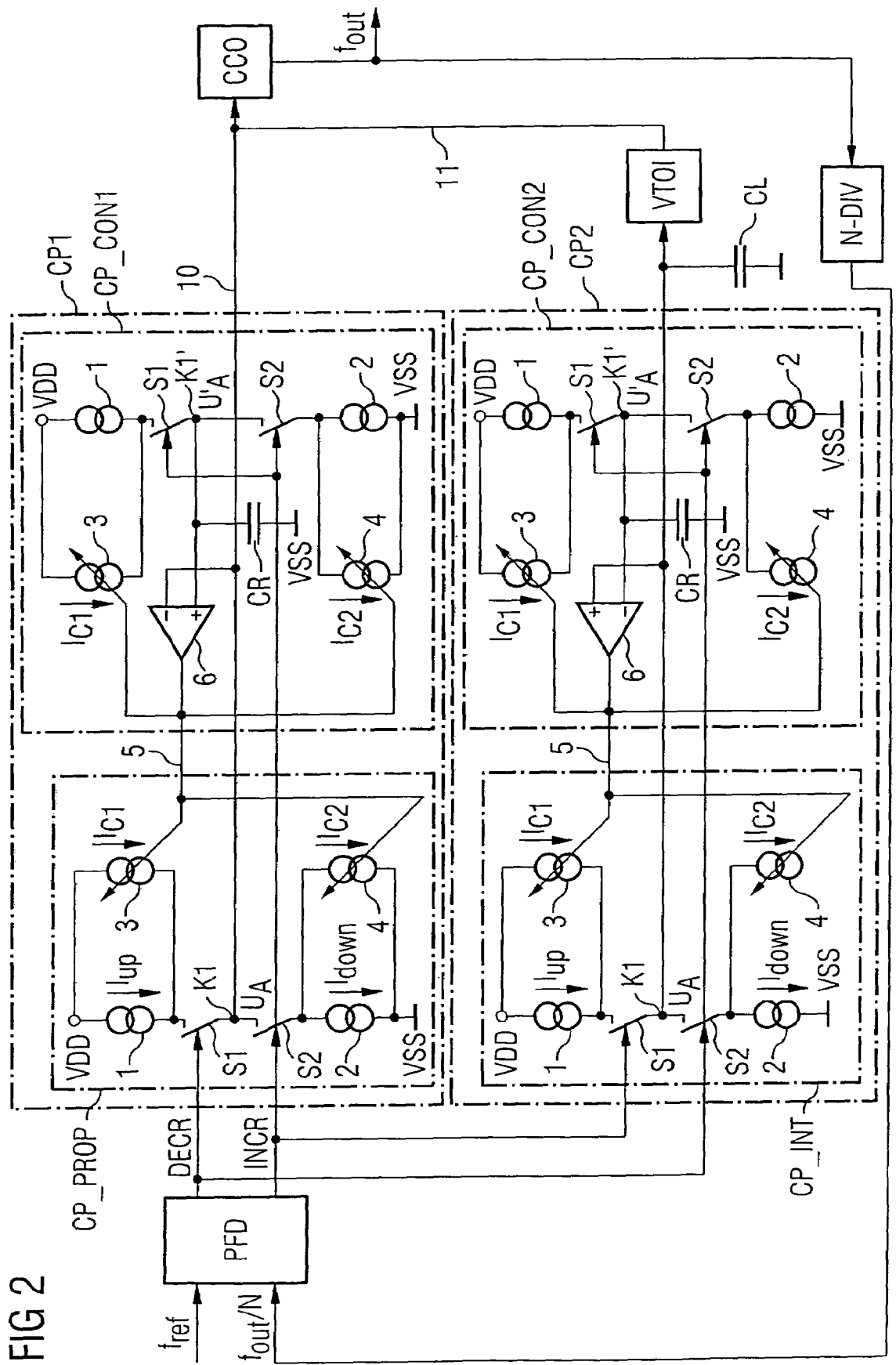

ERROR-COMPENSATED CHARGE PUMP CIRCUIT, AND METHOD FOR PRODUCING AN ERROR-COMPENSATED OUTPUT CURRENT FROM A CHARGE PUMP CIRCUIT

REFERENCE TO RELATED APPLICATIONS

This application claims the benefit of the priority date of German application DE 10 2004 019 652.4, filed on Apr. 22, 2004, the contents of which are herein incorporated by reference in their entirety.

FIELD OF THE INVENTION

The invention relates to an error-compensated charge pump circuit and to a method for producing an error-compensated output current from a charge pump circuit. The invention also relates to a PLL (phase locked loop) circuit having an error-compensated charge pump circuit.

BACKGROUND OF THE INVENTION

Phase locked loops, also called PLL circuits, are used in many technical fields of application. Inter alia, they are used for frequency multiplication, frequency division and as frequency synthesizers.

FIG. 1 shows a schematic illustration of the design of an ordinary PLL. This comprises a phase/frequency detector PFD which compares a reference frequency signal $f_{ref}$ with a frequency signal $f_{out}/N$, which is obtained by an N-fold frequency divider N_DIV from the output signal $f_{out}$ from a voltage-controlled oscillator VCO, for phase and frequency differences. The phase/frequency detector PFD outputs switching signals INCR and DECR which are characteristic of the phase and frequency difference between $f_{ref}$ and $f_{out}/N$. These switching signals INCR, DECR are supplied to a charge pump CP which charges and discharges a loop filter CL and thereby prescribes the voltage $V_0$ at the input of the voltage-controlled oscillator VCO.

In the steady state, $f_{out}=N \cdot f_{ref}$, and the two signals $f_{ref}$ and $f_{out}/N$ are in phase with one another.

The notional design of the charge pump CP, which is shown in FIG. 1, is known. The charge pump CP comprises two switched constant current sources 1, 2 that are arranged in series between VDD and VSS. The constant current source 1 produces a current $I_{up}$, and the constant current source 2 produces a current $I_{down}$. The constant current source 1 can be connected to the loop filter CL by means of a switch S1, and charges the loop filter when the switch is in the closed position. Correspondingly, the constant current source 2 (current sink) can be connected to the loop filter CL by means of a switch S2, and the loop filter CL is discharged with the current $I_{down}$ when S2 is in the closed position and S1 is in the open position. The output current from the charge pump CP, which current charges/discharges the loop filter CL, is thus formed by the difference between the two switched currents $I_{up}$ and $I_{down}$. The switches S1, S2 are in the form of MOS control transistors that are actuated by the switching signals INCR and DECR.

The switching signals INCR and DECR are binary signals. For the period in which the switching signal INCR (DECR) assumes the logic value 1 ("high"), the loop filter CL is charged with the current $I_{up}$ (discharged with the current $I_{down}$). The charge pump CP thus takes pulses of the switching signals INCR and DECR and produces proportional current pulses $I_{up}$ and $I_{down}$.

For the performance of a PLL, it is crucial for the current pulses to be produced with a high level of accuracy. The currents $I_{up}$ and $I_{down}$ are intended to be of the same magnitude. This is not always the case in practice, however. The reasons for this are: a mismatch in the speed of p-channel and n-channel transistors in the current sources, a mismatch in the drain/source voltages $U_{DS}$ of p-channel and n-channel transistors in the current sources, and differences in the current sources 1, 2 in the charge pump CP when p-channel and n-channel switching transistors S1, S2 are actuated in the same way.

In the steady state of the PLL, the following applies:

$$\int (I_{up}-I_{down})dt=0. \qquad (1)$$

If the currents $I_{up}$ and $I_{down}$ have different absolute values, it is necessary to compensate for this in the control loop operation in line with equation (1) through different duty cycles for the switching signals INCR and DECR. This is detrimental to the control accuracy of the PLL and causes systematic control jitter to occur.

The specification U.S. Pat. No. 6,611,160 describes a differential charge pump that comprises two charge pump circuits. The charge pump has complementary transistors that insulate the charge pump from switching noise that occurs in the switching transistors.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The invention is directed to an error-compensated charge pump circuit which, when used in a phase locked loop, allows a reduction in the systematic control jitter. The invention is also directed to a method for producing an error-compensated output current from a charge pump circuit which allows control operation in a phase locked loop with reduced systematic control jitter.

According to one aspect of the invention, the inventive charge pump circuit has a charge pump which has at least two current sources which are arranged in series and are each switched by an associated switching signal, where the difference between the currents produced in the two switched current sources contributes to the output current from the charge pump. In accordance with the invention, at least one of the two current sources is a current source which can be controlled by means of a control signal. The charge pump circuit also comprises a control circuit for producing the control signal for the at least one controlled current source, wherein the control circuit regulates the currents produced in the two switched current sources to the same value.

One idea on which the invention is based is to compensate for the different magnitudes of the currents $I_{up}$ and $I_{down}$ produced by the constant current sources by virtue of at least one of the two current sources being a controllable current source. This allows the absolute values of the charging and discharging currents provided by the charge pump circuit to be of the same magnitude. The result of this is that in the steady state of the control loop it is possible to use an identical or substantially identical duty cycle for the switching signals which switch the two current sources, which means that the control jitter in a PLL with an inventive charge pump is significantly reduced.

Whereas constant currents $I_{up}$ and $I_{down}$ with different absolute values in a PLL based on the prior art give rise to PLL control operation with different duty cycles, PLL control operation with ideally identical duty cycles for the switching signals is made possible in a PLL with the charge pump circuit of the present invention through regulation of the level of the discharging and/or charging currents.

In order to be able to set the charging and discharging currents obtained at the output of the charge pump (which corresponds to the output of the charge pump circuit) to (absolute-value) equality using the at least one controllable current source, the control circuit for producing the control signal is actuated in one embodiment by the output of the charge pump and by at least one of the switching signals.

One exemplary embodiment of the invention is characterized in that the control circuit has a control circuit charge pump, whose design is substantially identical to that of the charge pump, and has a differential amplifier which outputs the control signal. In this case, one input of the differential amplifier is connected to a node between the series-connected current sources of the charge pump, and the other input of the differential amplifier is connected to a node between the series-connected current sources of the control circuit charge pump.

The substantially identical circuit design for the charge pump and for the control circuit charge pump in one example makes it possible to compensate for systematic errors, such as the mismatch in the drain/source voltage $U_{ds}$ of the p-channel and n-channel transistors in the current sources of the charge pump or of the control circuit charge pump. The effect achieved by actuating the differential amplifier using the potentials between the series-connected current sources of the charge pump and control circuit charge pump is that in the steady state the operating point of the control circuit charge pump is simulated by the operating point of the charge pump.

In another embodiment of the invention the charge pump circuit is characterized in that the two switched current sources are controllable current sources and are actuated by the control signal. This means that the symmetry of the charge pump in relation to the production of the charging current and discharging current continues to be provided.

In one embodiment of the invention, the two current sources in the control circuit charge pump are jointly actuated by a single switching signal. This ensures that when the charge pump circuit is used in a PLL in the steady state the switching signals ideally have identical duty cycles.

A PLL circuit in line with the invention preferably comprises a current-controlled oscillator, with not only a first inventive charge pump circuit but also a further inventive charge pump circuit contributing to the control current for the current-controlled oscillator.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention is explained in more detail below using an exemplary embodiment with reference to the drawings, in which:

FIG. 2 is a schematic illustration of the circuit diagram for a PLL with two inventive charge pump circuits according to one exemplary embodiment of the present invention.

DETAILED DESCRIPTION OF THE INVENTION

Figure 1:
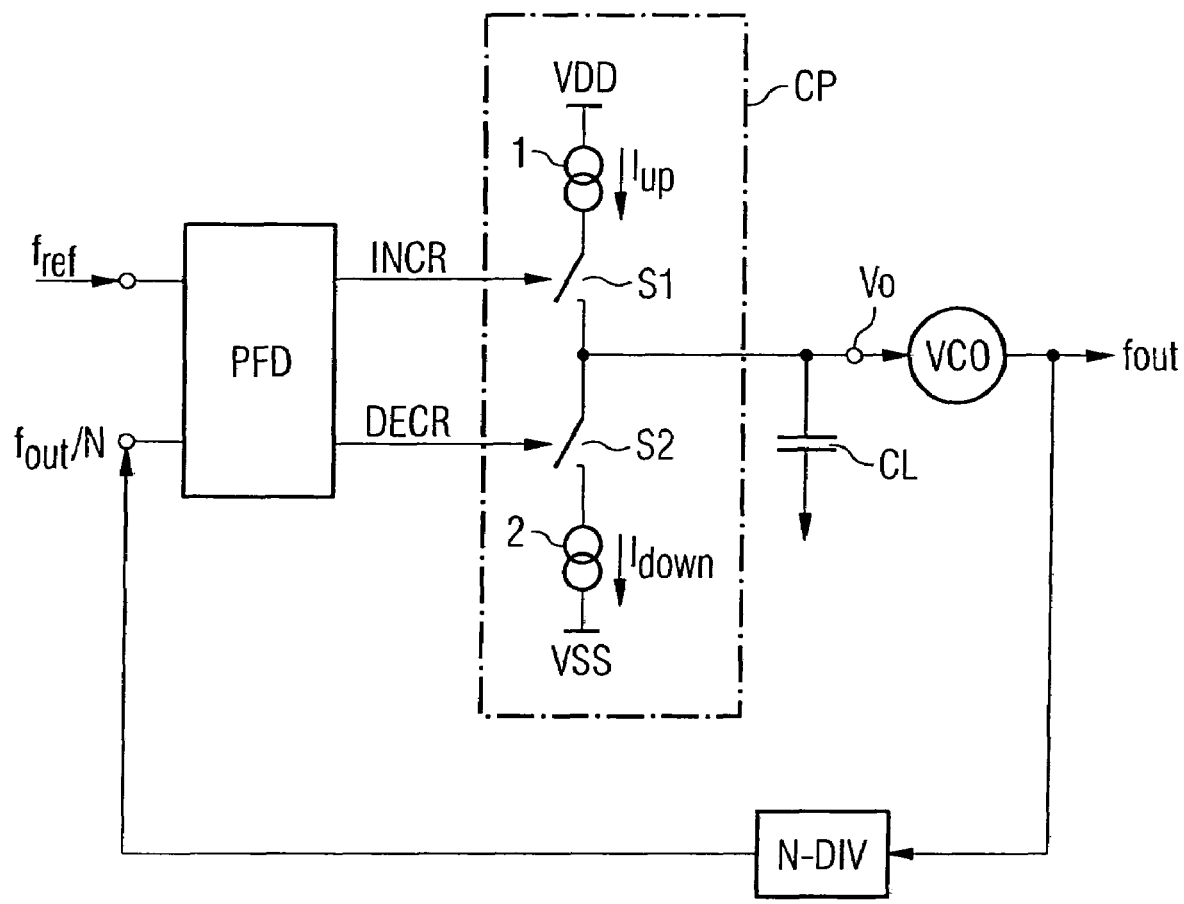
FIG. 1 is a schematic diagram of a PLL with a conventional charge pump according to the prior art.

Identical or similar circuit elements to those in FIG. 1 are denoted by the same reference symbols in FIG. 2. To avoid repetition, reference is made to the description relating to FIG. 1.

In accordance with one embodiment of the invention, the PLL has two charge pump circuits CP1 and CP2. The charge pump circuit CP1 comprises a charge pump CP_PROP and a control circuit CP_CON1. The charge pump circuit CP2 has a charge pump CP_INT and a control circuit CP_CON2.

The charge pump circuit CP1 is connected to the input of a current-controlled oscillator CCO by means of an electrical connection 10. In addition, the input of the CCO is connected to the output of the charge pump circuit CP2 by means of an electrical connection 11 and a voltage-to-current converter VTOI. A loop filter CL is charged/discharged by the output current from the charge pump circuit CP2.

The charge pump circuit CP1 represents the proportional path in the phase locked loop and affects the phase control of the PLL. The charge pump circuit CP2, the loop filter CL and the voltage-to-current converter VTOI represent the integral path of the control loop and effect the frequency control of the PLL. It should be pointed out that instead of a CCO it is also possible to provide a VCO after suitable current-to-voltage conversion in the electrical connection 10. In this case, the voltage-to-current converter VTOI is dispensed with (or the VTOI and the CCO form the VCO).

The text below gives a more detailed description of the design of the charge pump circuit CP1.

The charge pump CP_PROP differs from the charge pump CP shown in FIG. 1 by virtue of the constant current source 1 (which produces the constant current $I_{up}$) having a controllable current source 3 connected in parallel with it. Similarly, the constant current source (current sink) 2, which produces the constant current $I_{down}$, has a controllable current source 4 connected in parallel with it. The controllable current sources 3, 4 are voltage-controlled and are actuated by a common actuation signal 5. The controllable current source 3 produces a current $I_{c1}$ that is added to the constant current $I_{up}$. The controllable current source 4 produces a current $I_{C2}$ that is added to the current $I_{down}$ from the constant current source 2.

The electrical connection 10 is connected to a node K1 between the two switches S1 and S2. In this respect, the parallel circuit comprising the current sources 1 and 3 determines the charging current $I_{up}+I_{C1}$ and the parallel circuit comprising the current sources 2, 4 determines the discharging current $I_{down}+I_{C2}$, which both flow via the electrical connection 10.

The two controllable current sources 3, 4 may be produced with different input transistors (p-channel and n-channel transistors), for example, which means that the actuating response is different. Another option (not shown) is for the controllable current sources 3, 4 to be actuated by means of two separate actuation signals 5 (inverted and non-inverted).

It should be pointed out that, unlike in FIG. 1, the switch S1 is actuated by the switching signal DECR and the switch S2 is actuated by the switching signal INCR.

In terms of the circuit formed by the current sources 1, 2, 3, 4 and switches S1, S2, the control circuit CP_CON1, which provides the actuation signal 5 for the charge pump CP_PROP, has an identical design to the charge pump CP_PROP. Unlike the circuit design for the charge pump CP_PROP, however, the two switches S1 and S2 are actuated by the same switching signal (INCR). In addition, the node K1' between the switches S1 and S2 is used not to actuate the CCO but rather to drive the non-inverting input of a differential amplifier 6. The node K1' is also connected to VSS via a capacitor $C_R$.

The inverting input of the differential amplifier 6 is connected to the node K1 of the charge pump CP_PROP by means of the electrical connection 10.

It should be noted that in one embodiment the current sources 1, 2, 3, 4 and switching transistors S1, S2 in the charge pump CP_PROP and in the control circuit CP_CON1 are on the same chip and are produced using the same technologies.

The mode of actuation of the charge pump circuit CP1 is as follows: the differential amplifier 6 compares the voltage $U_A$ at the operating point (node K1) of the charge pump CP_PROP with the voltage $U'_A$ at the operating point (node K1') of the charge pump 1, 2, 3, 4, S1, S2 in the control circuit CP_CON1. The compensating currents $I_{C1}$ and $I_{C2}$ generated in the controllable current sources 3, 4 in the control circuit CP_CON1 are mirrored in the charge pump CP_PROP and are added to the constant currents $I_{up}$ and $I_{down}$ (which in practice are only approximately constant currents, since they have a certain dependency on the level of the operating point voltage $U_A$), which results in compensation for the systematic error (absolute-value discrepancy between $I_{up}$ and $I_{down}$). When $I_C = I_{C1} - I_{C2}$, the time profile for the voltage $U'_A(t)$ is as follows:

$$U'_A(t) = con1 + \frac{1}{C_R} \cdot \int_0^t (I_{up} - I_{down} + I_c) dt. \quad (2)$$

The transient condition is as follows:

$$U'_A(t) - U_A(t) = \text{const for } t \to \infty. \quad (3)$$

In the steady state, the operating points $U'_A$ and $U_A$ thus differ by a constant value const, the result of which is that the actuation signal 5 has the correct level for current compensation.

For the voltage $U_A(t)$ at the operating point (node K1) of the charge pump CP_INT (in the charge pump circuit CP2), the following applies:

$$U_A(t) = con2 + \frac{1}{CL} \cdot \int_0^t (I_{up} - I_{down} + I_c) dt \quad (4)$$

The operating point $U_A$ of the charge pump CP_PROP in the steady state is determined by the transfer function of the current-controlled oscillator CCO and is generally different from the operating point $U_A$ of the charge pump CP_INT in the steady state.

In equations (2) and (4), con1 and con2 denote constants that influence the transient period and can be set in suitable fashion by applying a charge (precharging) to capacitors (e.g. $C_R$) before the transient process (t=0).

In the steady state, the following applies:

$$\int (I_{up} - I_{down} + I_c) dt = 0 \text{ with the condition } DECR = INCR \text{ (duty cycle).} \quad (5)$$

On account of the total identity of the circuits CP_PROP and CP_CON1 in relation to the charge pump, the accuracy of the current compensation expressed by equation (5) is now determined only by the inevitable differences (mismatch) between identical transistors (in the case of operation with almost the same operating points $U_A$ and $U'_A$). In other words the inevitable transistor mismatch between transistors of substantially identical design—in the charge pumps in CP_PROP and CP_CON1, but no longer by a mismatch in $U_{DS}$ in p-channel and n-channel transistors in the charge pumps or as a result of differences between the constant current sources 1, 2 when the switching transistors S1 and S2 are actuated in the same way. It should further be pointed out that the inventive regulation of the compensating current $I_C$ of the present invention also corrects parasitic switching currents that arise as a result of the occurrence of parasitic charges during switching operations in the switching transistors S1, S2.

The design of the charge pump circuit CP2 corresponds essentially to the design of the charge pump circuit CP1, which is why a detailed description is not given, in order to avoid repetition. The only difference in relation to the circuit design is that in the charge pump CP_INT the switch S1 is actuated by the switching signal INCR and the switch S2 is actuated by the switching signal DECR, and that in the control circuit CP_CON2 the non-inverting input of the differential amplifier 6 is connected to the node K1 (operating point $U_A$) and the inverting input is connected to the node K1' (operating point $U'_A$) of the control circuit charge pump 1, 2, 3, 4, S1, S2. The whole circuit shown in FIG. 2 can be produced on a single chip.

The different actuation of the current-controlled oscillator CCO by the charge pump circuits CP1 and CP2—the charge pump circuit CP1 actuates the input of the CCO directly, while the charge pump circuit CP2 actuates the CCO using the loop filter CL and the voltage-to-current converter VTOI—means that the magnitudes of $U_A$, $U'_A$ in the control circuits CP_CON$_1$ and CP_CON2 and the magnitudes $I_{C1}$, $I_{C2}$ and $I_C$ in the charge pumps CP_PROP and CP_INT are generally different. Hence, different compensating currents $I_c$ are generally produced in the charge pump circuits CP1 and CP2, with the actuation signals 5 in the charge pump circuit CP1 and in the charge pump circuit CP2 generally also assuming different values (in the steady state). To avoid unnecessarily complex mathematical representation, the variability of the variables $I_{C1}$, $I_{C2}$, $I_C$, $U_A$ and $U'_A$ in the charge pump circuits CP1 and CP2 is not taken into account in the notation (e.g., through appropriate indexes).

One identical feature of the charge pump circuits CP1 and CP2, however, is the joint actuation by means of the switching signals DECR and INCR with the condition DECR=INCR (identical duty cycles) in the steady state.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A charge pump circuit, comprising:
   a charge pump having at least two current sources arranged in series and each switched by an associated switching signal, wherein a difference between currents produced in the at least two current sources contributes to an output current from the charge pump circuit, and wherein at least one of the at least two current sources comprises a controllable current source that generates a current magnitude that is controlled by a control signal; and
   a control circuit configured to produce the control signal for the controllable current source, wherein the control circuit regulates the currents produced in the at least two current sources to substantially the same value, and wherein the control circuit is coupled to an output of the charge pump and to at least one of the switching signals associated with the at least two current sources.

2. A charge pump circuit, comprising:
   a charge pump having at least two current sources arranged in series and each switched by an associated switching signal, wherein a difference between currents produced in the at least two current sources contributes to an output current from the charge pump circuit, and wherein at least one of the at least two current sources comprises a controllable current source that generates a current magnitude that is controlled by a control signal; and
   a control circuit configured to produce the control signal for the controllable current source, wherein the control circuit regulates the currents produced in the at least two current sources to substantially the same value, and wherein the control circuit comprises:
   a control circuit charge pump having a configuration that is substantially identical to that of the charge pump; and
   a differential amplifier configured to output the control signal, wherein one input of the differential amplifier is connected to a node between the series-connected current sources of the charge pump, and the other input of the differential amplifier is connected to a node between the series-connected current sources of the control circuit charge pump.

3. The charge pump circuit of claim 1, wherein the at least two current sources of the control circuit charge pump are both switched by the at least one of the switching signals.

4. The charge pump circuit of claim 1, wherein the at least two current sources are both controllable current sources and are both controlled by the control signal.

5. The charge pump circuit of claim 1, wherein the controllable current source comprises a constant current source and a controllable compensating current source connected in parallel with the constant current source.

6. A method for producing an error-compensated output current from a charge pump circuit having at least two current sources arranged in series that are each switched by an associated switching signal, each current source producing a current, wherein a difference between the currents produced in the two current sources contributes to an output current from the charge pump circuit, comprising variably controlling the current produced in at least one of the current sources such that the currents produced in the two current sources are regulated to the same value, and wherein the currents are regulated based on a potential at the output of the charge pump and further based on at least one of the switching signals.

7. A method for producing an error-compensated output current from a charge pump circuit having at least two current sources arranged in series that are each switched by an associated switching signal, each current source producing a current, wherein a difference between the currents produced in the two current sources contributes to an output current from the charge pump circuit, comprising variably controlling the current produced in at least one of the current sources such that the currents produced in the two current sources are regulated to the same value, and wherein the charge pump circuit further comprises a control circuit having a control circuit charge pump having a configuration that is substantially identical to that of the charge pump, the variable controlling of the current further comprising:
   comparing potentials that appear at a node between the series-connected current sources of the charge pump and at a node between the series-connected current sources of the control circuit charge pump; and
   controlling the current produced in at least one of the current sources of the charge pump based on the comparison.

8. The method of claim 7, further comprising switching the two current sources of the control circuit charge pump by the at least one of the switching signals.

9. A phase locked loop system, comprising:
   a detector circuit configured to compare a reference signal and a feedback signal and generate two switching signals having the same duty cycle in response thereto;
   a charge pump circuit configured to receive the two switching signals and generate, in conjunction with a loop filter, a tuning signal in response thereto;
   a controllable oscillator circuit configured to receive the tuning signal and generate a phase locked loop output signal in response thereto; and
   a divider circuit configured to generate the feedback signal by dividing down the phase locked loop output signal,
   wherein the charge pump circuit further comprises:
      a first current source and a first switch;
      a second current source and a second switch, and
      a control circuit configured to produce a control signal;
      wherein the first and second current sources are serially coupled together through the first and second switches, respectively, the first and second switches having a node therebetween,
      wherein the control circuit is coupled to the node and to at least one of the two switching signals, and
      wherein a current of the first or second current source is varied based on the control signal.

10. The phase locked loop system of claim 9, wherein the first and second switches are driven by respective ones of the two switching signals.

11. The phase locked loop system of claim 9, wherein the control circuit comprises a differential amplifier configured to compare the value at the node to another value and generate the control signal in response thereto.

12. The phase locked loop system of claim 9, wherein the control circuit further comprises a control circuit charge pump having a configuration substantially identical to that of the charge pump circuit, and having a control circuit node between respective switches thereof, wherein the differential amplifier circuit is configured to compare the value at the node of the charge pump circuit with the value at the node of the control circuit charge pump.

13. The phase locked loop system of claim 9, wherein the first current source comprises a first constant current source and a first variable current source coupled in parallel therewith, and wherein the second current source comprises a second constant current source and a second variable current source coupled in parallel therewith, wherein a current of the first and second variable current sources is a function of the value at the node.

14. The phase locked loop system of claim 9, wherein the current of the first or second current source is varied based on the control signal such that the first and second currents produced in the first and second currents sources are the same over a predetermined time period.

* * * * *